(12) United States Patent
Fairbanks (10) Patent No.: US 6,191,658 B1
(45) Date of Patent: Feb. 20, 2001

(54) HIGH SPEED COUPLED OSCILLATOR TOPOLOGY

(75) Inventor: Scott M. Fairbanks, Mountain View, CA (US)

(73) Assignee: Sun Microsystems, Inc., Palo Alto, CA (US)

( * ) Notice: Under 35 U.S.C. 154(b), the term of this patent shall be extended for 0 days.

(21) Appl. No.: 09/422,885

(22) Filed: Oct. 21, 1999

(51) Int. Cl.[7] .................................................. H03B 5/24
(52) U.S. Cl. ........................................ 331/57; 331/177 R
(58) Field of Search .............................. 331/57, 111, 143, 331/177 R (56) References Cited

U.S. PATENT DOCUMENTS 5,592,126 * 1/1997 Boudewijns et al. ................... 331/45
5,592,127 * 1/1997 Mizuno ................................... 331/57

* cited by examiner

*Primary Examiner*—David Mis
(74) *Attorney, Agent, or Firm*—Philip H. Albert; Townsend and Townsend and Crew LLP (57) ABSTRACT

An oscillator circuit having a topology that provides for high-speed oscillation in an even number of phases. The topology generally comprises an even number of inverting circuit elements generally including a keeper and an even number of inverters. The circuit elements are connected such that each output of each circuit element is coupled to at least one input of a neighboring circuit element such that a signal traversing a closed path is inverted an odd number of times. One oscillator is implemented using circuit elements containing a keeper having two nodes and two pairs of inverters. The outputs of one pair of inverters are tied to a first node of the keeper and the outputs of the other pair are tied to a second node. In a preferred embodiment, the oscillator circuit contains four such circuit elements arranged in a ring such that the outputs of each circuit element are coupled to the two neighbor circuit elements.

20 Claims, 6 Drawing Sheets

HIGH SPEED COUPLED OSCILLATOR TOPOLOGY

BACKGROUND OF THE INVENTION

This invention relates to oscillator circuits and in particular to an improved oscillator topology for use with high speed oscillator circuits.

Oscillator circuits that use delay elements are found in numerous applications to provide timing signals for handling information. Such applications include voltage controlled oscillators (VCO's), phase locked loops, clock references, local oscillators for frequency conversion, frequency synthesis, and time multiplexing of data. Generally, the faster the oscillator the more information that can be delivered per unit time. In addition, a faster oscillator provides for finer phase separation. The fastest prior art oscillators are LC oscillator circuits having an inductive and capacitive element connected in series. Such LC oscillators can achieve frequencies of up to 2–3 gigahertz (GHz).

Unfortunately, LC oscillators have many drawbacks. For example, LC oscillators have a low control range, which is typically dependent on the square root of the inverse of the product of the inductance and the capacitance. LC oscillators are limited to two-phase operation. LC oscillators have low output swings and, thus, require amplification to achieve a suitable signal level.

Figure 1A:
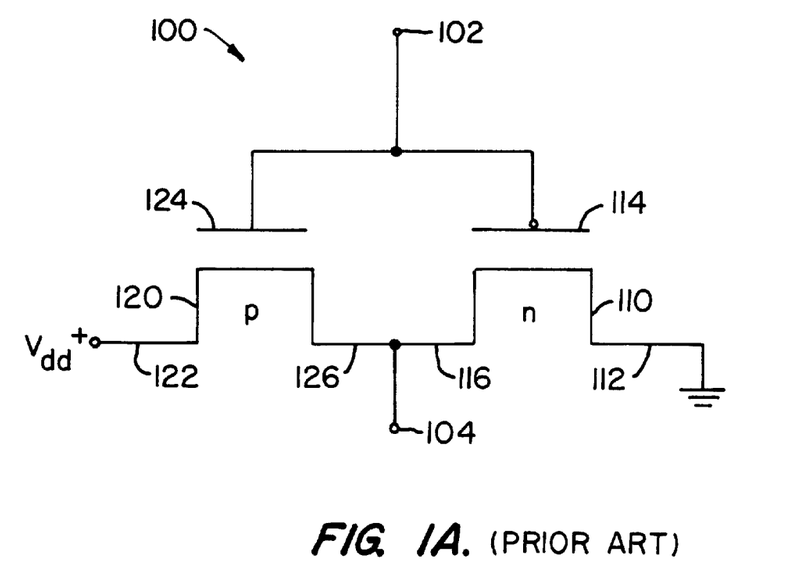
FIG. 1(a) is a schematic diagram of an inverter gate of the prior art.

To overcome these drawbacks, oscillators were developed from inverting delay elements. An inverter is a circuit element in which the output is the opposite of the input. For example, if the input to an inverter is a high voltage corresponding to a logical 1, the output will be a low voltage or a logical 0. A typical inverter circuit is shown in FIG. 1(a). Inverter circuit 100 generally comprises a NMOS transistor 110 and a p-type transistor 120. Transistor 110 has a source 112, a gate 114 and a drain 116. Current will flow between source 112 and drain 114 through transistor 110 if a sufficiently large positive voltage is applied to gate 116. In such a condition transistor 110 is said to be transparent. If the positive voltage applied between gate 116 and source 112 is below a threshold value $V_{TN}$, transistor 110 is said to be opaque, i.e., little or no current can flow between source 112 and drain 114. Similarly, transistor 120 has a source 122, a gate 124 and a drain 126. Transistor 120 will be transparent if a sufficiently large negative voltage is applied between gate 126 and source 122 and opaque if the gate-source voltage is below a threshold value VTP. Gates 114 and 124 are tied together at an input 102. Drains 116 and 126 are tied together at an output 104. Source 112 is connected to a source voltage $V_{source}$ and source 122 is connected to ground, e.g., zero volts. When input 102 is a logical 1, e.g., an applied voltage of order $V_{source}$, transistor 110 becomes transparent and transistor 120 becomes opaque. Thus a logical 1 is transmitted to output 104. If a logical 0, e.g., a ground voltage is applied to input 102 transistor 120 becomes transparent and transistor 110 becomes opaque. Thus, a logical zero is transmitted to output 104.

The voltage difference between a logical 0 and logical 1, known as the voltage swing, depends on the type of inverter element used. For inverters made from power transistors the voltage swing can be as large as 100 volts. In the prior art, the fastest oscillator constructed from delay elements was simply three inverters connected in a ring. Such a circuit is known as a three-inverter ring oscillator.

Figure 1B:
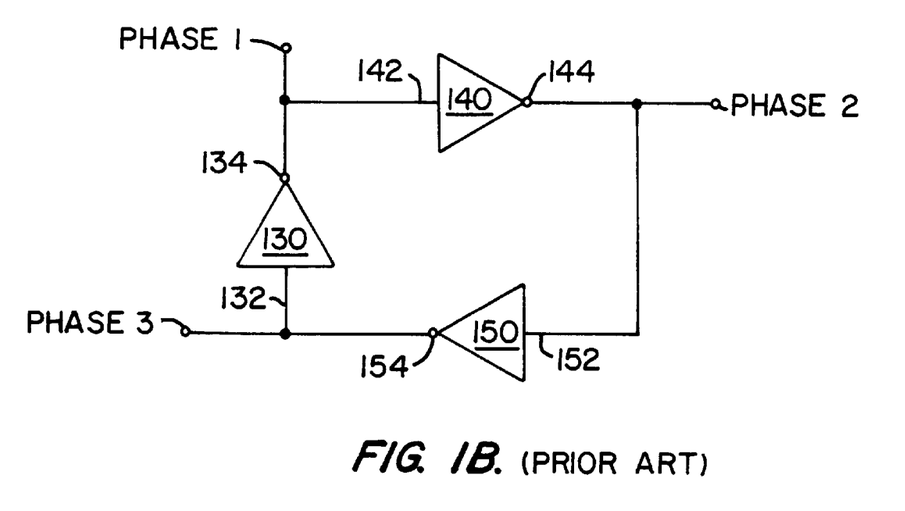
FIG. 1(b) is a block diagram of a three gate ring oscillator of the prior art.

FIG. 1(b) shows a typical three-inverter ring oscillator 101 of the prior art (sometimes called a three-gate ring). In the oscillator 101, inverters 130, 140, 150 having inputs 132, 142, 152 and outputs 134, 144, and 154 are connected in a ring, i.e., the output of each inverter is coupled to the input of the next inverter in the ring. For example, output 134 of inverter 130 is coupled to input 142 of inverter 140. When inverters 130, 140, 150 are connected in this way, the output of each inverter can be made to oscillate between 1 and 0. Such an oscillator is known as a three-gate ring. Since ring oscillators provide a full swing in voltage from logical 0 to logical 1, amplification is usually unnecessary. Three gate ring circuits made with 0.6 micron CMOS transistors can oscillate at approximately 2.3 gigahertz (GHz).

A three inverter ring oscillator is said to have three phases because each of the three outputs transition between states at different times, due to the delay between the change of a given input and the change of the corresponding output. If finer phase separation is required, more stages must be added as in a five or seven gate ring oscillator. Unfortunately, adding more stages makes the circuit oscillate slower and the number of stages must be odd. Even numbered phases are desirable in applications such as decoding center clocks generating quadrature for telecommunications, clock recovery and serial data transfer but an even number of stages would not oscillate. Oscillators that operate in an even number of phases can be used to synthesize other frequencies with 75%, 50% and 25% duty cycles. Even phased oscillators can also be used to de-skew local clocks. Even numbered phase ring oscillators can be built, but additional circuitry is needed which reduces the frequency and complicates the design.

SUMMARY OF THE INVENTION

The present invention provides an oscillator circuit having a topology that provides for high-speed oscillation in an even number of phases. The present invention may be used in many types of circuits and systems, for example, computer systems or microprocessors. The topology generally comprises an even number of inverting circuit elements. Each circuit element generally includes a keeper and an even number of inverters. The circuit elements are connected such that each output of each circuit element is coupled to at least one input of a neighboring circuit element such that a signal traversing a closed path is inverted an odd number of times.

The invention is implemented using inverting circuit elements containing two pairs of inverters and a keeper having two nodes. In each circuit element, the outputs of one pair of inverters are tied to a first node of the keeper and the outputs of the other pair are tied to a second node. In a preferred embodiment, the oscillator circuit contains four such circuit elements arranged in a ring such that the outputs of each circuit element are coupled to the inputs of two neighbor circuit elements. The preferred embodiment of the oscillator circuit is implemented in CMOS using a 2:1 PMOS to NMOS width ratio. Competing currents at the inputs of the inverters bias the transistors in their active regions such that all the transistors are always on. The output of the NMOS and PMOS inverters oscillates between their respective threshold voltages at up to 3.31 GHz.

One advantage of the improved oscillator described herein is that one embodiment oscillates 46% faster than a ring of three optimally sized inverters.

DESCRIPTION OF THE SPECIFIC EMBODIMENTS

In the figures, like elements are labeled with like numbers and different instances of like elements are labeled with like numbers and different parenthetical numbers or letters. Herein, the following terminology is used: a "node" is an input into, or an output from, a circuit. A "keeper" is two inverters connected such that the output of each is connected to the input of the other.

Figure 2A:
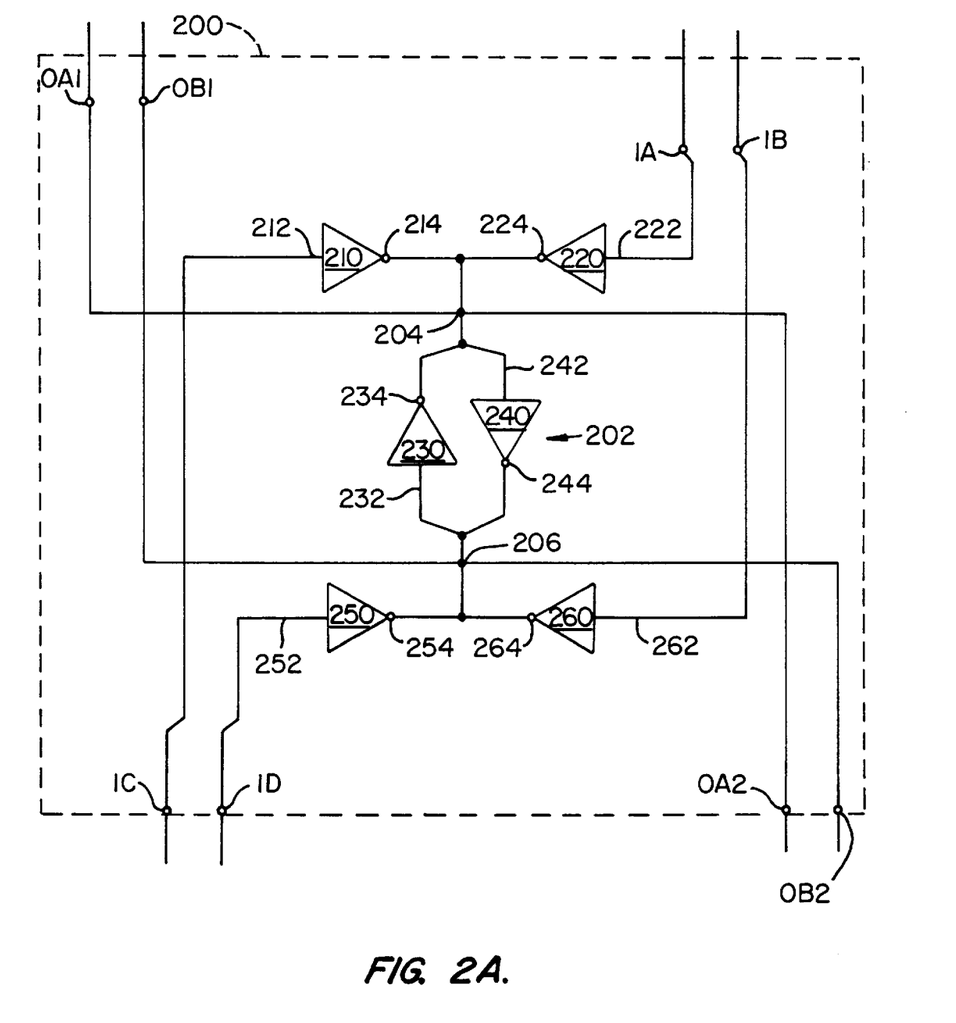
FIG. 2(a) is a block diagram of an embodiment of a circuit element of the present invention.

FIG. 2(a) is a block diagram of a circuit element 200 for an oscillator circuit (or "oscillator" for short). The circuit element is constructed from 6 inverters 210, 220,230, 240, 250, 260 having inputs 212, 222, 232, 242, 252, 262 and outputs 214, 224, 234, 244, 254, 264. Inverters 230 and 240 are cross tied and comprise a keeper 202.

Inverters 210 and 220 have outputs 214 and 224 that are connected to the keeper 202 at a node 204. Similarly, inverters 250 and 260 have outputs 254 and 264 that are connected to the keeper 202 at a node 206. Keeper 202 maintains a value of the voltage on nodes 204 and 206 when they are not otherwise driven. Keeper 202 also keeps nodes 204 and 206 complementary; i.e., logical inversions of each other. Nodes 204 and 206 serve as the outputs for circuit element 200. Similarly, inputs 212, 222, 252 and 262 serve as the inputs to the circuit element 200. Thus, for claim purposes, each of the inputs and outputs of circuit element 200 is labeled in FIG. 2(a), with the corresponding labels shown for one circuit element in FIG. 3(a). Note that circuit element 200 has four inputs (IA, IB, IC, ID) and four outputs (OA1/2, OB1/2). In operating circuit element 200, it is preferred that inputs IA and IB are complementary. That is, the value of IA is the logical inversion of IB and vice versa. The same is true for inputs IC and ID.

The components making up circuit element 200 make up a C-element function also known as a Muller-C function. Generally, a C-element changes the logical value of its output only when both its inputs change. The output voltage of a C-element may change slightly when either of its inputs changes, but not enough to change the logical value of the output. Circuit element 200, however, has four inputs and two outputs. In particular, the circuit element 200 is a type of majority circuit, i.e., a circuit in which the output at nodes 204 and 206 changes only when a majority of the inverters sourcing nodes 204 and 206 agree.

Circuit element 200 may be constructed using any suitable binary logic device to construct the inverters 210, 220, 230, 240, 250 and 260. Suitable binary logic devices include, but are not limited to, junction, complimentary-metal-oxide-semiconductor (CMOS), silicon-on-insulator (SOI), bipolar, field effect (FET), Gallium Arsenide (Gas) transistors and vacuum tubes. In a preferred embodiment, circuit element 200 is implemented in CMOS using PMOS and NMOS transistors in inverters 210, 220, 250 and 260 in a 2:1 PMOS to NMOS width ratio.

Figure 2B:
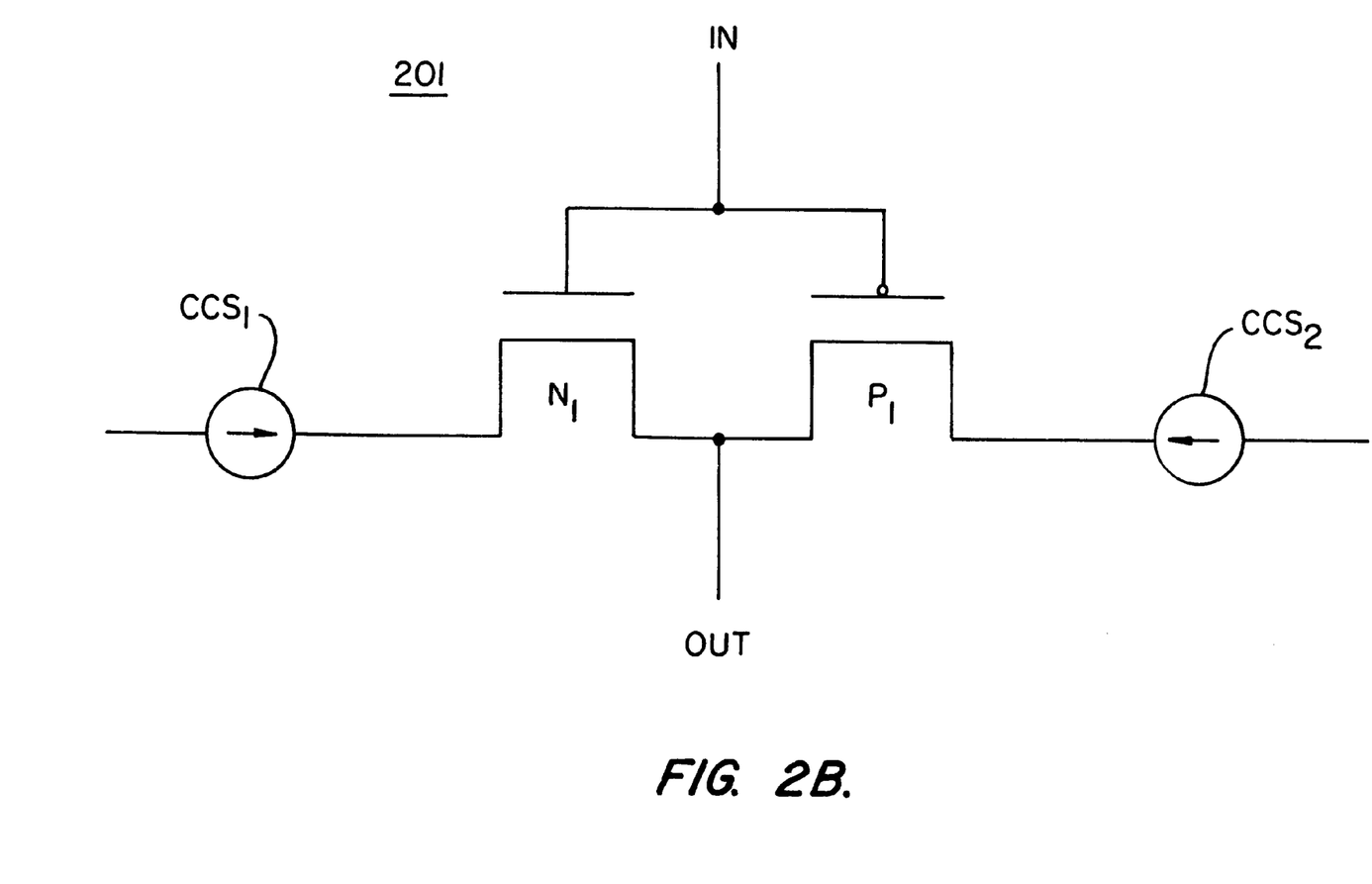
FIG. 2(b) is a schematic diagram of an embodiment an inverter gate used in the circuit element of FIG. 2(a)

For many applications it is often useful that the inverters in circuit element 200 of FIG. 2(a) contain current limiting elements. Controlling the current is one way of controlling the frequency of oscillation. An example of such a current controlled inverter 201 is depicted in FIG. 2(b). Inverter 201 generally comprises a p-type transistor $P_1$, an n-type transistor $N_1$ and controlled current sources $CCS_1$ and $CCS_2$. Transistors $P_1$ and $N_1$ can be implemented, for example, as PMOS and NMOS transistors respectively. Controlled current sources $CCS_1$ and $CCS_2$ are coupled in series with transistors $P_1$ and $N_1$ respectively. Controlled current sources $CCS_1$ and $CCS_2$ limit the amount of current that transistors $P_1$ and $N_1$ can source. $CCS_1$ and $CCS_2$ can be voltage controlled current sources or current controlled current sources implemented, for example, using PMOS and NMOS transistors.

Figure 3A:
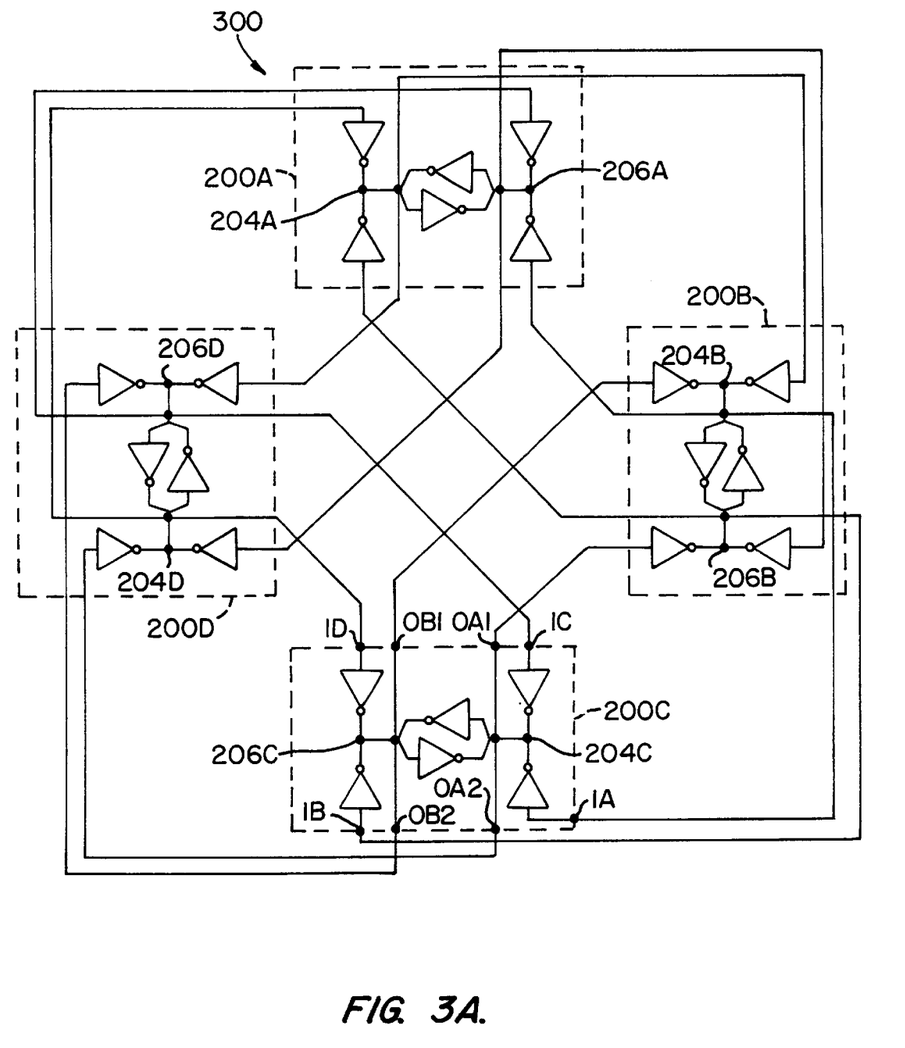
FIG. 3(a) is a schematic diagrams of alternative illustrations of the oscillator circuit of FIG. 3(a)

FIG. 3(a) is a block diagram of an oscillator circuit 300 constructed from four circuit elements 200A, 200B, 200C and 200D having nodes 204A, 204B, 204C, 204D, 206A, 206B, 206C and 206D. Note that each circuit element has four inputs and two outputs. Each of the outputs of a given circuit element is connected to an input of its two neighboring circuit elements (i.e., the two adjacent ones). In order for oscillator circuit 300 to oscillate, the inputs are generally initialized with alternating high and low values. For example nodes 204A, 204B, 204C, 204D can be initialized to 0 volts and nodes 206A, 206B, 206C and 206D can be initialized to 3.3 volts. To those skilled in the art of asynchronous hardware, oscillator 300 can be thought of as a four stage chain-of-rendezvous (COR) that is initialized half full.

Figure 3B:
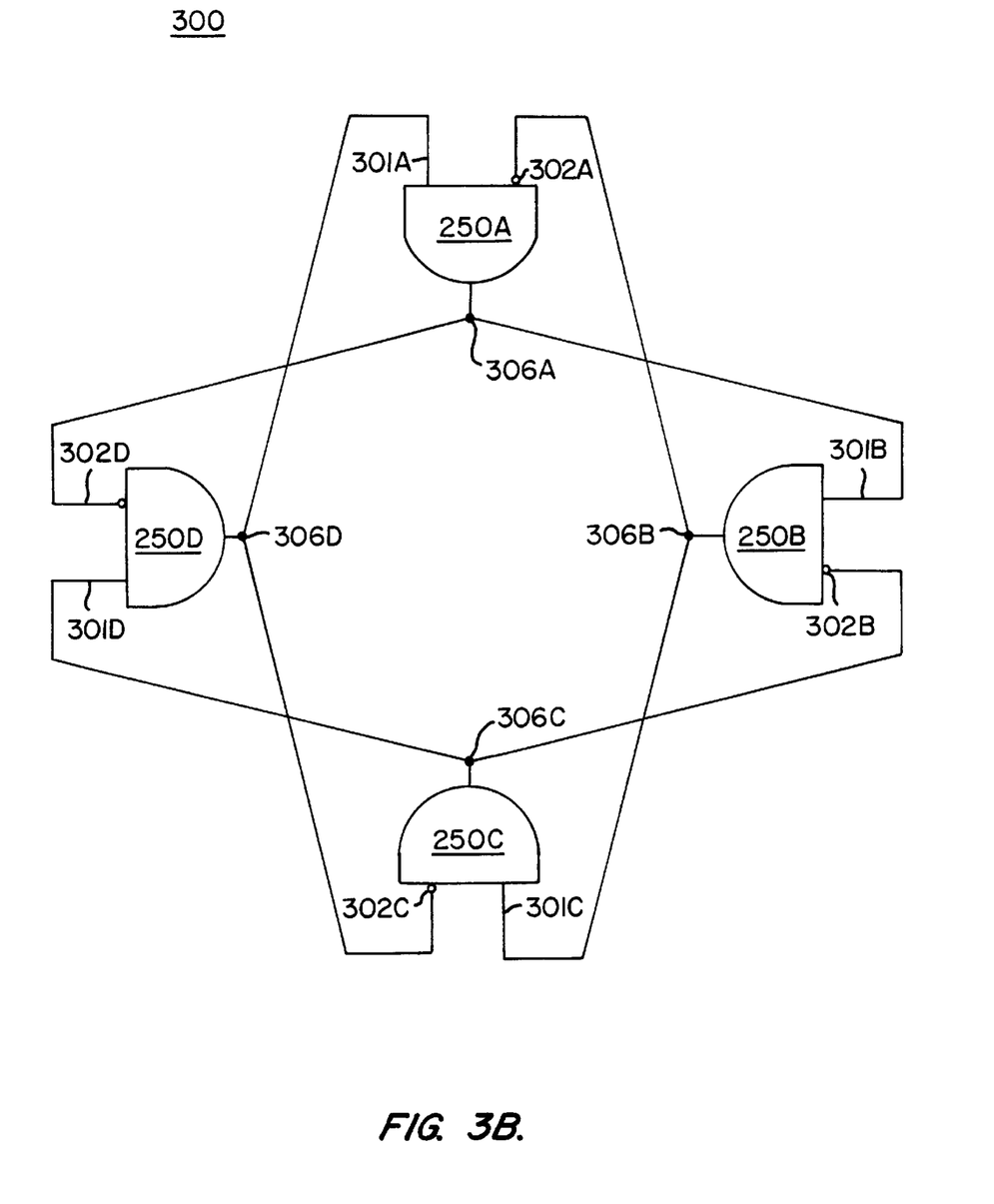

FIG. 3(b) is a simplified representation of the topology of oscillator 300 wherein circuit elements 200A, 200B, 200C and 200D are drawn as four C-elements 250A, 250B, 250C and 250D. For the sake of simplicity of illustration, circuit elements 250A, 250B, 250C and 250D are drawn with only two inputs 301A, 302A, 301B, 302B, 301C, 302C, 301D, 302D and a single output 306A, 306B, 306C, 306D. Furthermore, inputs 302A, 302B, 302C and 302D are inverting inputs, i.e. they include components that perform logical inversion. Inputs 301A, 301B, 301C and 301D, by contrast, are non-inverting inputs.

C-elements 250A, 250B, 250C and 250D are configured such that a signal traversing a path that begins and ends at the same output is logically inverted an odd number of times. Specifically, the inputs of a circuit element and the output of its complementary circuit element (i.e., opposite one) are not directly connected in this embodiment. Any number of inversions N may occur within each C-element as long as the number of inversions is the same for all four C-elements. For example, suppose each C-element performs one inversion on a signal arriving at either input, i.e., N=1. A signal starting, at, say, output 306A can traverse, for example, a closed path through non-inverting input 301B, C-element 250B and inverting input 302A and C-element 250A ending at output 306A. Such a signal is inverted once by C-element 250B, inverted a second time by inverting input 302A, and inverted a third time by C-element 250A before returning to output 306A. Note that if the C-elements do not invert at all, i.e., N=0, the signal is only inverted once, at input 302A, in traversing the same path.

The oscillator topology increases the frequency of oscillation by reducing the load driven by the transistors. For example, the topology of the oscillator circuit 300, may be implemented in CMOS such that two of every three transistors share their drain diffusion regions. This leaves a capacitance that is a fraction of the capacitance found at the drains of two transistors that do not share their drain diffusion regions while preserving the full drive of two transistors. As a result, the capacitance at the nodes is reduced by approximately one third. Consequently only two thirds of the initial load need be driven and inverter transitions take two thirds the time. The reduction in time corresponds to a 50% increase in frequency of oscillation.

Notice that C-elements are 250A, 250B, 250C and 250D abstractions of circuit element 200 shown in FIG. 2(*a*). The circuit elements of FIG. 2(*a*) and FIG. 3(*a*), by contrast, have two pairs of complementary inverting inputs and a pair of complementary outputs. In the circuit element 200 of FIG. 2(*b*) and each C-element of FIG. 3(*b*) there is one path from an input to an output having an even number of inversions and another path having an odd number of inversions. In FIG. 3(*b*), the two different types of input represent the different types of paths.

The topology of the oscillator 300 also enables it to oscillate in two phases. Referring to FIG. 3(*a*), note that the shortest path between a node, e.g., node 204A, and the complement of that node, i.e., node 206C, is two inverters, not counting the paths through keeper. The shortest closed path (i.e., one that begins and ends at the same node) is three inverters. If transitions occur on both sides of keeper 202A simultaneously and both transitions have equivalent paths back to the other side of the keeper simultaneous 202A transitions occur on opposite sides of the keeper after two inverter delays. Consequently, all the gates in oscillator 300 switch after every other transition. Thus, oscillator 300 is said to oscillate in two phases. In a three inverter ring oscillator, by contrast, all gates switch after every third transition.

To understand the operation of the oscillator circuit 300, consider a circuit element such as element 200 implemented in CMOS. The inverters 210, 220, 230, 240, 250 and 260 contain PMOS and NMOS transistors that operate between a source voltage Vsource and a ground voltage GND. As used herein, the term "ground" will be used generically to refer to a common base voltage of a circuit. The NMOS transistors are opaque below threshold voltage $V_{TN}$ that is slightly above GND. The p-type transistors are opaque above a threshold voltage $V_T$ that is slightly below Vsource. If V exceeds $V_{TP}$, the PMOS transistor becomes opaque and the NMOS transistor pulls V down. If V drops below $V_{TN}$, the NMOS transistor becomes opaque and the NMOS transistor pulls V up. Both types of transistors are transparent, i. e., conducting in the region between $V_{TN}$ and $V_{TP}$. Thus, both the n-type and p-type transistors are said to operate mostly in the active region. In the topology of the oscillator circuit 300, the gates of all transistors reach the intermediate voltage before switching. When the final input of one of the elements does switch, a smaller increment of voltage needs to be applied to the transistor gates before the appropriate transistors begin conducting.

By way of example, for 3.3 V process, V typically swings between about 0.7V and about 2.6V. At 0.7V the n-type transistors are just barely turned "off". When the voltage is approximately 0.8V that transistor is now "on" and starts to pull the voltage at its drain down. The PMOS transistor whose gate is on the same node as that drain need only be pulled down to about 2.5V before turning on.

Because the transistors in the oscillator 300 are kept mostly in the active region, there is a linear relationship between the charges on their gates and the currents conducted through their drains. This linear relationship facilitates fast operation. By contrast, in a prior art three-inverter ring oscillator, the transistor gates must be charged a complete threshold voltage before they get out of the barely conducting cut-off region.

The output at node 204 depends on the voltages at inputs 212 and 222. When the voltage at one of the inputs 212, 222 changes and the other has not, the voltage at node 204 settles at an intermediate value $V_O$, somewhere in between the threshold values $V_{TN}$ and $V_{TP}$ for the NMOS and PMOS transistors in the inverters 210 and 220. The intermediate value is thus said to be in the active region "between the rails" defined by $V_{TN}$ and $V_{TP}$. Keeper 202 maintains V at this intermediate value. Note that at any node, such as node 204, there are three inverters, e.g., 210, 220, 230, sourcing into that node. If, for example, inverter 210 changes, inverter 210 tries to change the logical value of the output of node 204 while inverters 220 and 230 try to maintain the previous logical value of the output. Thus, the value of $V_O$ is determined by two inverters trying to drive the voltage in one direction and one inverter trying to drive the voltage in the other direction. At the intermediate voltage, all inverters source current into the output node, i.e., all the inverters are active. Moreover, none of the transistors in the inverters are fully turned off, i.e., opaque.

Figure 4:
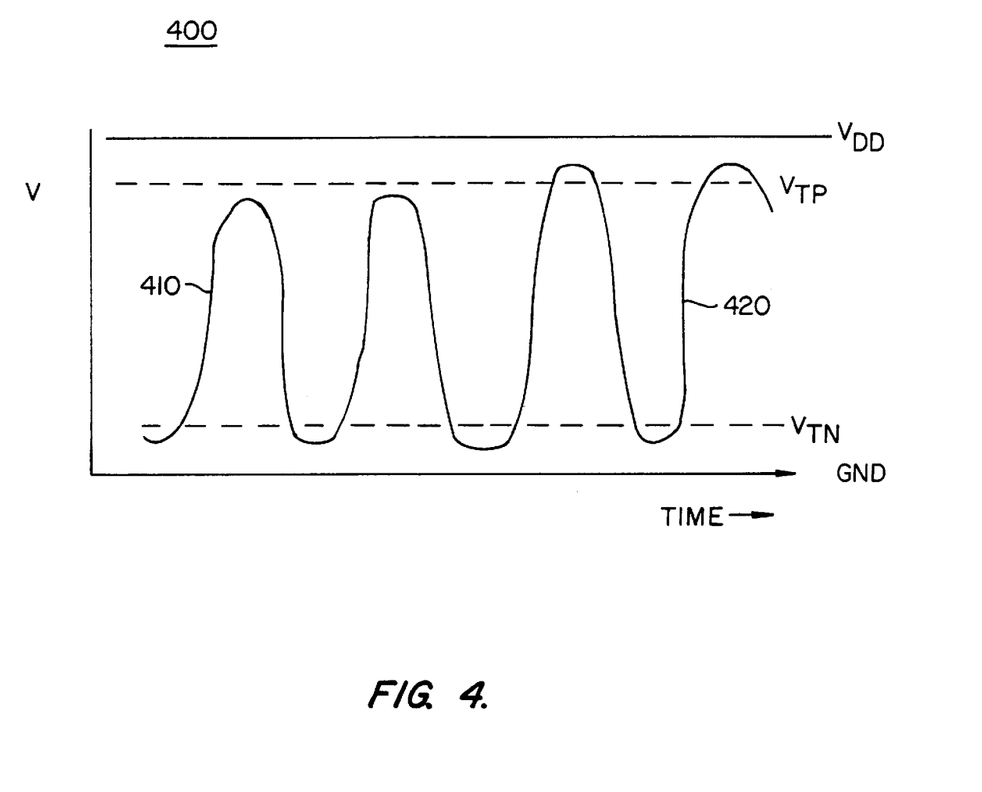
FIG. 4 is a graph of voltage vs. time for the oscillator circuit of FIG. 3(a)

FIG. 4 illustrates graphs of the behavior of the voltage V at one of the nodes oscillator circuit 300 as a function of time. Curve 410 indicates that it is not necessary for the voltage to exceed $V_{TP}$ before reversing. Since the NMOS transistors can generally source more current than the PMOS transistors, the NMOS transistors will pull V down as the voltage approaches $V_{TP}$. This type of operation is provides for oscillation at the highest frequencies; approximately 3.31 GHz in one prototype. Such an oscillator circuit was simulated using the program HSPICE using models from a 0.6$\mu$process. This prototype used only n-type transistors in the "keeper inverters" 230 and 240. Such a high frequency is generally achieved at a cost in robustness, i.e., stability of operation. Somewhat more robust operation can be obtained if, for example, V exceeds $V_{TP}$ during oscillation as depicted in 420. This type of oscillation can be achieved by using both n-type and p-type transistors in the keeper inverters 230 and 240. The improved robustness is obtained at a cost in maximum oscillation frequency, about 2.5 GHz in the one prototype.

It is preferred for the circuit element of FIG. 2(*a*) to be symmetric with respect to its inputs. That is, within the limits of the process, at inputs IA, IB, IC, ID inverters 210, 220, 250, 260 have the same size, layout, input capacitance and drive strength. To achieve this, the inverters 210, 220, 250 and 260 that are connected to the inputs need to be the same size. This allows the PMOS and NMOS transistors in the inverters to share the fill width of their drains. In the preferred embodiment, the widths of the PMOS and NMOS transistors in inverters 210, 220, 250, and 260 are in a 2:1 ratio. In a specific example of the preferred embodiment the PMOS transistors were approximately 10.2 microns wide and the NMOS transistors were approximately 5.1 microns wide. The keeper inverters 230 and 240 generally contain transistors having widths somewhere intermediate to those used in inverters 210, 220, 250 and 260. In the specific example of the preferred embodiment, inverters 230 and 240 contained NMOS transistors only having a width of approximately 5.7 microns. Such a circuit is capable of oscillation at a frequency of at least 3.31 GHz.

Although an oscillator has been described herein in terms of a circuit that oscillates in two phases, the oscillator can be made to oscillate in more phases than two phases. For example sixty-four elements 200 could be arranged in a ring oscillator circuit to make a distributed clock that oscillates in four phases. Those skilled in the art will be able to devise other circuits that take advantage of oscillation in an even number of phases upon review of this disclosure.

For example, the oscillator circuit disclosed herein can be implemented as a voltage controlled oscillator by suitable modification of the basic design. For example, the oscillator circuit 300 of FIG. 3(a) may be implemented with inverters of the type shown in FIG. 2(b) wherein the gates of the transistors are coupled to received feedback from a phase detector. In this way oscillator circuit 300 could be used as a voltage controlled oscillator (VCO).

In summary, a oscillator circuit topology has now been described, including several variations. The foregoing description of preferred embodiments of the invention has been presented for the purposes of description. It is not intended to be exhaustive or to limit the invention to the precise form described, and modifications and variations are possible in light of the teaching above. For example, given the explanation above, it will be appreciated that oscillator circuits can be designed using the principles of this invention which have different numbers of circuit elements that oscillate at high frequency in an even number of phases.

What is claimed is:

1. An oscillator circuit, comprising:
   an even number of circuit elements, wherein each circuit element of the even number of circuit elements has at least two input and at least one output, wherein a signal applied to a first input of said at least two inputs is inverted an odd number of times between said first input and said output and a signal applied to a second input of said at least two inputs is inverted an even number of times; and
   inter-connections among said even number of circuit elements such that each output of each of said even number of circuit elements is coupled to at least one input of a neighboring circuit element such that a signal is inverted an odd number of times in traversing a closed path beginning and ending at any one of said at least one outputs of any of said even number of circuit elements.

2. The oscillator circuit of claim 1, wherein each circuit element of said even number of circuit elements comprises an even number of inverters and a keeper.

3. The oscillator circuit of claim 1, wherein the oscillator circuit oscillates in an even number of phases.

4. The oscillator circuit of claim 1, wherein said even number of circuit elements comprises four circuit elements arranged in a ring wherein an output of each circuit element is coupled to at least one input of each of two neighboring circuit elements.

5. The oscillator circuit of claim 1, wherein each of said even number of circuit elements contains:
   a keeper having first and second nodes;
   a first pair of inverters, each inverter of said first pair having an output coupled to said first node; and
   a second pair of inverters, each inverter of said second pair having an output coupled to said second node.

6. An oscillator circuit comprising:
   an even number of circuit elements containing inverters, wherein;
   each of said circuit elements has at least one input and at least one output, said circuit elements being connected such that each output of each circuit element is coupled to at least one input of each of at least two neighboring circuit elements whereby a signal is inverted an odd number of times in traversing a closed path beginning and ending at a given output.

7. The oscillator circuit of claim 6, wherein each of said even number of circuit elements contains:
   a keeper having first and second nodes;
   a first pair of inverters, each inverter of said first pair having an output coupled to said first node; and
   a second pair of inverters, each inverter of said second pair having an output coupled to said second node.

8. The oscillator circuit of claim 7 wherein at least one inverter in said first or second pairs of inverters includes a controlled current source.

9. The oscillator circuit of claim 8 wherein said oscillator circuit is a voltage controlled oscillator.

10. The oscillator circuit of claim 7, wherein each inverter in said first and second pair of inverters contains a plurality of transistors that are biased in their active regions.

11. The oscillator circuit of claim 7, wherein each inverter in said first and second pair of inverters contains a plurality of CMOS transistors.

12. The oscillator circuit of claim 11, wherein said plurality of CMOS transistors includes a plurality of NMOS transistors and a plurality of PMOS transistors.

13. The oscillator circuit of claim 12, wherein each of said PMOS transistors has a width that is approximately twice as much as a width of each of said NMOS transistors.

14. The oscillator circuit of claim 13, wherein said keeper contains a plurality of NMOS keeper transistors, each of said NMOS keeper transistors having a width that is greater than said width of each of said NMOS transistors.

15. The oscillator circuit of claim 14, wherein said keeper contains a lurality of PMOS keeper transistors, each of said PMOS keeper transistors having a idth that is approximately the same as said width of said NMOS keeper transistors.

16. A method for providing an oscillating signal, comprising:
   providing an even number of circuit elements, each circuit element having at least two inputs and at least one output;
   interconnecting said even number of circuit elements such that each output of each of said even number of circuit elements is coupled to at least one input of a neighboring circuit element of said even number of circuit elements;
   providing a signal at a selected output of at least one circuit element of said even number of circuit elements; and
   inverting said signal an odd number of times in traversing a closed path through two or more circuit elements of said even number of circuit elements, said closed path beginning and ending at said selected output.

17. The method of claim 16, wherein said even number of circuit elements oscillate in an even number of phases.

18. The method of claim 16, wherein said even number of circuit elements comprises four circuit elements arranged in a ring.

19. The method of claim 16, wherein each circuit element has one or more transistors, each of said one or more transistors being operable in an active region.

20. The method of claim 19, wherein competing currents bias said one or more transistors in said active region.

* * * * *